United States Patent
Kim et al.

(10) Patent No.: US 9,287,215 B2
(45) Date of Patent: Mar. 15, 2016

(54) SOURCE DRIVER INTEGRATED CIRCUIT AND DISPLAY DEVICE COMPRISING SOURCE DRIVER INTEGRATED CIRCUIT

(71) Applicant: SILICON WORKS CO., LTD., Daejeon-si (KR)

(72) Inventors: Ji Hun Kim, Daejeon-si (KR); Kyong Jik Min, Seoul (KR); Hae Won Lee, Cheongju-si (KR); Byung Yun Jin, Cheongju-si (KR)

(73) Assignee: SILICON WORKS CO., LTD., Daejeon-Si (KR)

( * ) Notice: Subject to any disclaimer, the term of this patent is extended or adjusted under 35 U.S.C. 154(b) by 0 days.

(21) Appl. No.: 14/380,266

(22) PCT Filed: Dec. 28, 2012

(86) PCT No.: PCT/KR2012/011809
§ 371 (c)(1),
(2) Date: Aug. 21, 2014

(87) PCT Pub. No.: WO2013/100735
PCT Pub. Date: Jul. 4, 2013

(65) Prior Publication Data
US 2015/0014712 A1    Jan. 15, 2015

(30) Foreign Application Priority Data

Dec. 28, 2011  (KR) .................. 10-2011-0144271

(51) Int. Cl.
| | | |
|---|---|---|
| *H01L 29/18* | (2006.01) | |
| *H05K 7/00* | (2006.01) | |
| *H01L 23/02* | (2006.01) | |
| *H01L 29/40* | (2006.01) | |
| *H01L 23/538* | (2006.01) | |
| *G09G 3/36* | (2006.01) | |
| *H01L 23/522* | (2006.01) | |

(Continued)

(52) U.S. Cl.
CPC .......... *H01L 23/5386* (2013.01); *G09G 3/3688* (2013.01); *G09G 3/3696* (2013.01);

(Continued)

(58) Field of Classification Search
CPC . H01L 23/538; H01L 23/522; H01L 23/5386; H01L 23/5228; H01L 23/50; H01L 27/0207; G09G 3/20; G09G 3/3688; G09G 3/3696
USPC .................... 257/88, 773, 678, 786
See application file for complete search history.

(56) References Cited

U.S. PATENT DOCUMENTS 7,446,844 B2 *  11/2008  Hong ............................ 349/152
2002/0020899 A1 *  2/2002  Ohashi ......................... 257/678

(Continued)

FOREIGN PATENT DOCUMENTS

| CN | 102033341 | 4/2011 |
|---|---|---|
| CN | 102254523 | 11/2011 |

(Continued)

OTHER PUBLICATIONS

International Search Report for International Application No. PCT/KR2012/011809, dated Apr. 1, 2013.

*Primary Examiner* — Long K Tran
*Assistant Examiner* — Dzung Tran
(74) *Attorney, Agent, or Firm* — Kile Park Reed & Houtteman PLLC

(57) ABSTRACT

A source driver integrated circuit comprises a common node; a plurality of pads for inputting power, a portion of which are connected to an external power source and the remainder of which are connected to the portion through the common node; and a common power line which is connected to the plurality of power input pads through the common node. As a result, the resolution of adjacent channels varies very little and block dimming between channels can be resolved.

14 Claims, 3 Drawing Sheets

(51) Int. Cl.
    *H01L 27/02*     (2006.01)
    *H01L 27/15*     (2006.01)

(52) U.S. Cl.
    CPC ........ *H01L23/5228* (2013.01); *H01L 27/0207* (2013.01); *H01L 27/156* (2013.01); *G09G 2300/0426* (2013.01); *G09G 2310/0291* (2013.01); *G09G 2320/0233* (2013.01); *H01L 2924/0002* (2013.01)

(56) References Cited

U.S. PATENT DOCUMENTS

2004/0108594 A1*   6/2004   Toyosawa ................. 257/734
2006/0113648 A1*   6/2006   Chung et al. .............. 257/678
2007/0138654 A1*   6/2007   Kim .......................... 257/786
2008/0128902 A1*   6/2008   Chung et al. .............. 257/735
2009/0167730 A1    7/2009   Kwak et al.
2011/0089576 A1    4/2011   Choi et al.

FOREIGN PATENT DOCUMENTS

| | | |
|---|---|---|
| JP | 2003-323152 | 11/2003 |
| KR | 10-2009-0072393 | 7/2009 |
| KR | 10-2009-0130507 | 12/2009 |
| KR | 10-2011-0033328 | 3/2011 |
| KR | 10-2011-0126991 | 11/2011 |
| KR | 10-2011-0133812 | 12/2011 |

* cited by examiner

SOURCE DRIVER INTEGRATED CIRCUIT AND DISPLAY DEVICE COMPRISING SOURCE DRIVER INTEGRATED CIRCUIT

BACKGROUND OF THE INVENTION

1. Field of the Invention

The present disclosure relates to a display device, and more particularly, to a source driver integrated circuit that minimizes voltage level deviation of each power supplied to a plurality of channels in a display panel and optimizes an image of the display panel, and a display device including the source driver integrated circuit.

2. Description of the Related Art

FIG. 1 illustrates an embodiment of a conventional display device.

Referring to FIG. 1, the conventional display device includes a printed circuit board (PCB) 100 that controls the entire operation of the display device, a display panel 360 in which a plurality of pixels are two-dimensionally arranged, source driver integrated circuits 320 and 340 that control the operation of the display panel 360 as COG (Chip On Glass), and a flexible printed circuit board (FPCB) 200 that electrically connects the PCB 100 to the source driver integrated circuits 320 and 340 by using LOGs (Line on Glasses) 301, 302, 303, and 304.

Among them, the source driver integrated circuits 320 and 340 and the display panel 360 are installed on a panel glass 300, and the PCB 100 and the source driver integrated circuits 320 and 340 are electrically connected to each other by using the LOGs 301, 302, 303, and 304.

The display panel 360 includes a plurality of channels Chc, Chc+1, Che, and Che+1, and power is supplied to the respective channels Chc, Chc+1, Che, and Che+1 through respective metal lines 305 to 310. The metal lines 305 to 310 electrically connect pads 323 to 326 and 343 to 346 for outputting panel driving signals to the plurality of channels Chc, Chc+1, Che, and Che+1, and may be LOGs.

Referring to FIG. 1, it can be understood that the lengths of supply paths P11, P12, P13, and P14 of the panel driving signals supplied to two adjacent channels Chc and Chc+1 or Che and Che+1 are equal to each other. This is because two pads 321 and 322/341 and 342 for inputting power installed at one side around the center of the two the source driver integrated circuits 320 and 340 are vertically symmetrical to each other about the centers of the source driver integrated circuits 320 and 340, respectively, and power is supplied to all the pads 321, 322, 341, and 342 from the FPCB 200.

The power supplied from the FPCB 200 via the LOGs 301, 302, 303, and 304 is transferred through metal lines provided in the two source driver integrated circuits 320 and 340. In this case, since the metal line has a line sheet resistance (RL) of a predetermined size, voltage levels of power at two points spaced apart from each other are small, but a predetermined difference exists. Accordingly, the fact that the lengths of the supply paths P11, P12, P13, and P14 are equal to each other represents that an absolute value of power is not known but relative values of the power are equal to each other.

FIG. 1 illustrates only one type of power line as the LOG for the purpose of simplification, but when considering signals and different types of power lines, since an area occupied by the LOG is actually significant, the use of a large number of LOGs may increase the entire size of a device.

In order to solve such a problem, a scheme for reducing the number of LOGs for supplying power has been proposed for use. That is, in the source driver integrated circuits 320 and 340, the pads 321, 322, 341, and 342 for inputting power and the lines are designed for vertical symmetry, but a power source is connected for use only to the pads 321 and 342 for inputting power of the source driver integrated circuits 320 and 340 due to space insufficiency of the LOG lines 301, 302, 303, and 304 in a COG connection.

FIG. 2 illustrates another embodiment of a conventional display device.

Referring to FIG. 2, LOGs 301 and 303 are electrically connected to the two source driver integrated circuits 320 and 340 from FPCB 200, respectively. Accordingly, power is supplied only to one pad 321 of pads 321 and 322 for inputting power installed in the one source driver integrated circuit 320, and power is supplied only to one pad 341 of pads 341 and 342 for inputting power installed in the other source driver integrated circuit 340.

In this case, it can be understood that the lengths of supply paths P21, P22, P23, and P24 of panel driving signals supplied to two channels Chc and Chc+1 or Che and Che+1 are different from each other. That is, the supply paths P21 and P23 of the panel driving signals supplied to one pair of channels Chc and Che of the two pairs of adjacent channels Chc and Che+1, and Che and Che+1 are shorter than the supply paths P22 and P24 of the panel driving signals supplied to the other pair of channels Chc+1 and Che+1.

In this case, since the supply paths P21 and P23 of the panel driving signals are short, a predetermined difference occurs between an image provided by the channels Chc and Che which receive panel driving signals having a relatively high voltage level, and an image provided by the channels Chc+1 and Che+1 which are adjacent to the channels Chc and Che, but receive panel driving signals having a relatively low voltage level.

In other words, when the power source is connected for use only to the pads 321 and 341 for inputting power of the source driver integrated circuits 320 and 340, there is a problem that a right and left pixel image difference of the source driver integrated circuits 320 and 340 and an image difference between the source driver integrated circuits 320 and 340 occur due to resistance deviation of the supply paths P21, P22, P23, and P24 of the panel driving signals, which are arranged at the right and left of the source driver integrated circuits 320 and 340.

SUMMARY OF THE INVENTION

Accordingly, the present invention has been made in an effort to solve the problems occurring in the related art, and an object of the present invention is to provide a source driver integrated circuit capable of minimizing voltage level deviation of panel driving signals supplied to a plurality of channels in a display panel and optimizing an image of the display panel, and a display device including the source driver integrated circuit.

In order to achieve the above objects, according to one aspect of the present invention, there is provided a source driver integrated circuit, including a common node; a plurality of pads for inputting power, a portion of the pads being connected to an external power source, a remainder of the pads being connected to the portion through the common node; and a common power line connected to the plurality of pads for inputting power through the common node.

In an embodiment, the portion is electrically connected to the external power source through LOG (Line On Glass).

In an embodiment, the source driver integrated circuit may further include a plurality of driving signal output pads connected to the common power line and symmetrically arranged about the common node.

In an embodiment, among the plurality of driving signal output pads, symmetrical driving signal output pads provide driving signals to channels symmetrical about the common node, respectively.

In an embodiment, resistance values between the common node and the symmetrical channels are substantially equal to each other.

In an embodiment, distance values between the common node and the symmetrical channels are substantially equal to each other.

In an embodiment, the source driver integrated circuit may further include buffers arranged between the common node and the channels, respectively.

In an embodiment, the plurality of pads for inputting power are symmetrically arranged about the common node.

According to another aspect of the present invention, there is provided a source driver integrated circuit, including a plurality of pads for inputting power, a portion of the pads being directly connected to an external power source, a remainder of the pads being indirectly connected to the external power source; an internal power line that connects the plurality of pads for inputting power to each other; and a common power line that connects external channels to each other, wherein substantial center points of the internal power line and the common power line are connected to each other.

In an embodiment, the source driver integrated circuit may further include: a plurality of driving signal output pads; a plurality of panel driving circuits that generate panel driving signals by using power transferred from the plurality of driving signal output pads; and a metal line that connects the plurality of panel driving circuits to the plurality of driving signal output pads, respectively.

In an embodiment, the internal power line is branched from a substantial center point of the plurality of pads for inputting power, and is connected to a substantial center point of the plurality of panel driving circuits.

In an embodiment, the source driver integrated circuit may further include buffers arranged between the plurality of panel driving circuits and the plurality of driving signal output pads, respectively In an embodiment, resistances between the common power line and adjacent panel driving circuits are substantially equal to each other.

In an embodiment, the portion receives one of a ground voltage, a supply voltage, and an intermediate supply voltage.

According to yet another aspect of the present invention, there is provided a display device, including a display panel in which a plurality of pixels are two-dimensionally arranged; and a source driver integrated circuit including a common node, a plurality of pads for inputting power, a portion of the pads being connected to an external power source, a remainder of the pads being connected to the portion through the common node, and a common power line connected to the plurality of pads for inputting power through the common node.

In an embodiment, the source driver integrated circuit includes: two pads for inputting power installed at one side; a plurality of panel driving circuits that generate panel driving signals by using power transmitted from the pads for inputting power; a plurality of panel driving signal output pads installed at the other side; a first metal line that connects the two pads for inputting power to each other, is branched from points spaced apart from each of the two pads for inputting power by a same distance, and is connected to center parts of the plurality of panel driving circuits; and a second metal line that connects the plurality of panel driving circuits to the plurality of panel driving signal output pads, respectively.

In an embodiment, the source driver integrated circuit may further include a plurality of buffers arranged between respective output of the plurality of panel driving circuits and the panel driving signal output pads, respectively.

In an embodiment, resistance values between the first metal line and the symmetrical panel driving circuits are substantially equal to each other.

In an embodiment, in the source driver integrated circuit, only one of the pads for inputting power receives power.

In an embodiment, the display device may further include: a printed circuit board (PCB) that performs a function of driving and controlling the display device; and a flexible printed circuit board (PCB) that transfers power supplied from the printed circuit board to one of the two pads for inputting power.

In accordance with a source driver integrated circuit and a technology (technologies) related to the source driver integrated according to an embodiment of the present invention, in order to minimize an area of a display device, power is connected to only a portion of pads for inputting power, and the remainder of the pads for inputting power is connected to the portion of the pads for inputting power (that is, power is branched about the source driver integrated circuit), so that the resolution of adjacent channels varies very little.

In accordance with the source driver integrated circuit and the technology (technologies) related to the source driver integrated according to the embodiment of the present invention, transfer paths of panel driving signals supplied to a plurality of channels in a display panel are equal to each other, so that block dimming between channels in chips can be resolved and block dimming between the chips can be removed.

DETAILED DESCRIPTION OF PREFERRED EMBODIMENTS

Figure 1:
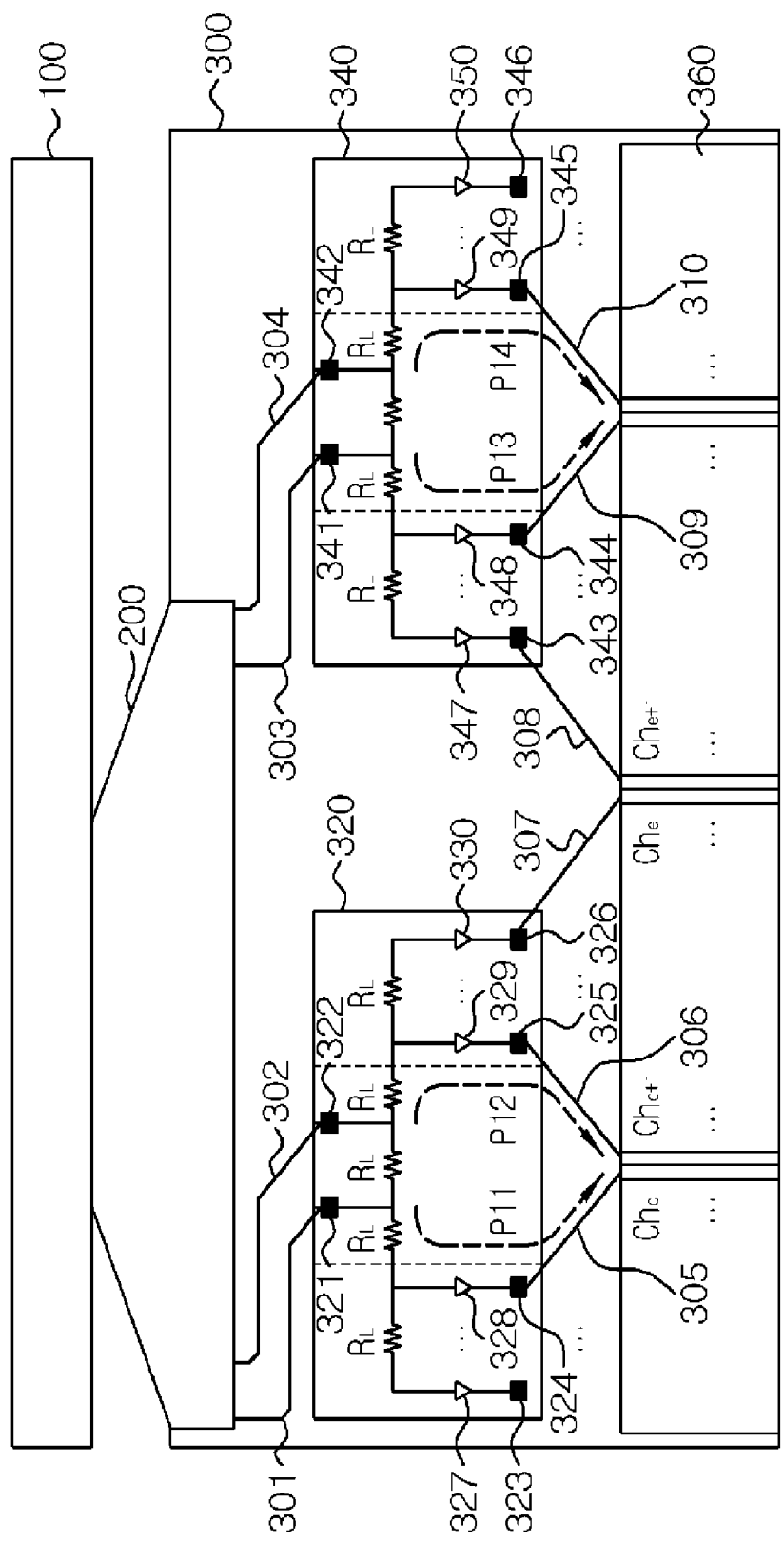
FIG. 1 illustrates an embodiment of a conventional display device.
Figure 2:
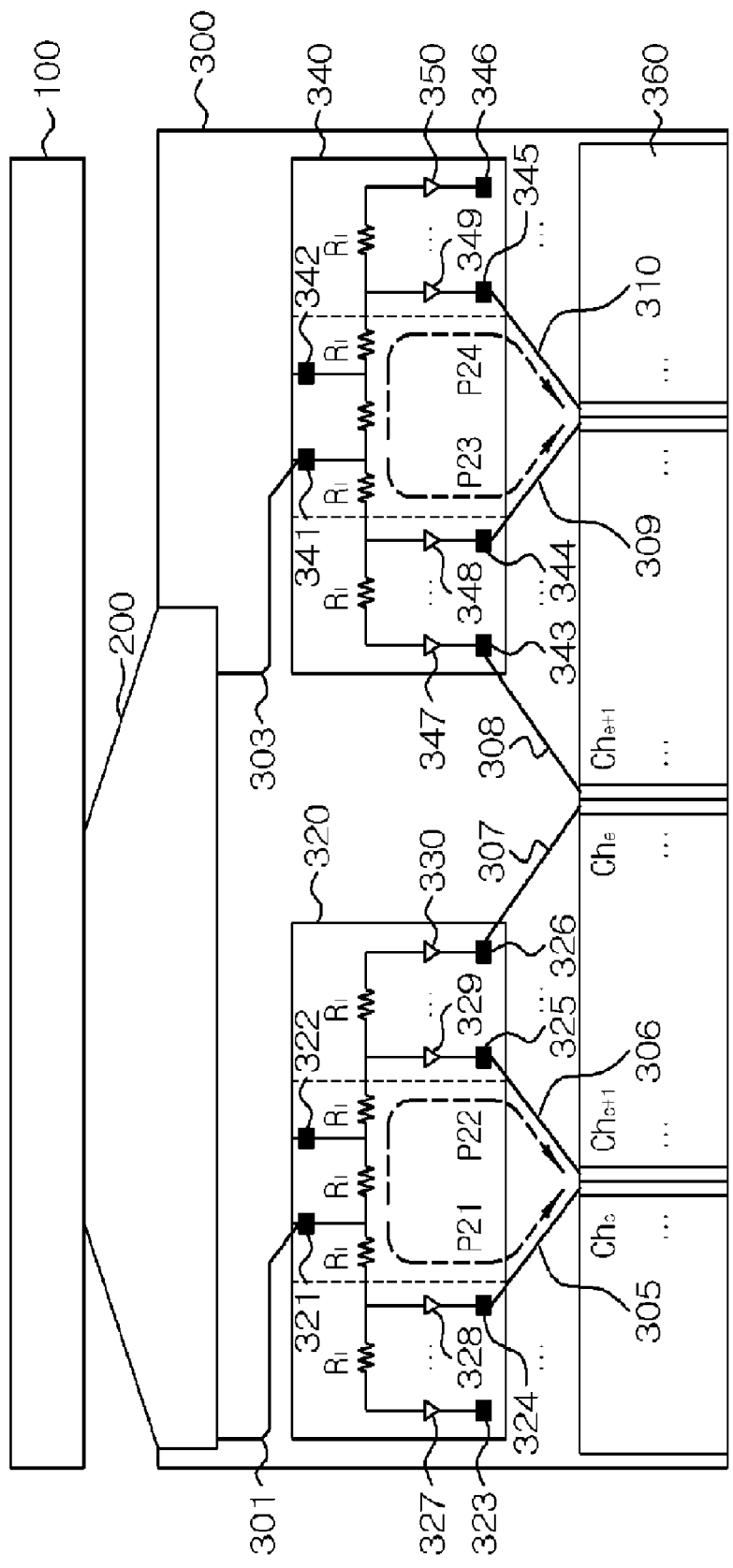
FIG. 2 illustrates another embodiment of a conventional display device.

Exemplary embodiments will be described below in more detail with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

Figure 3:
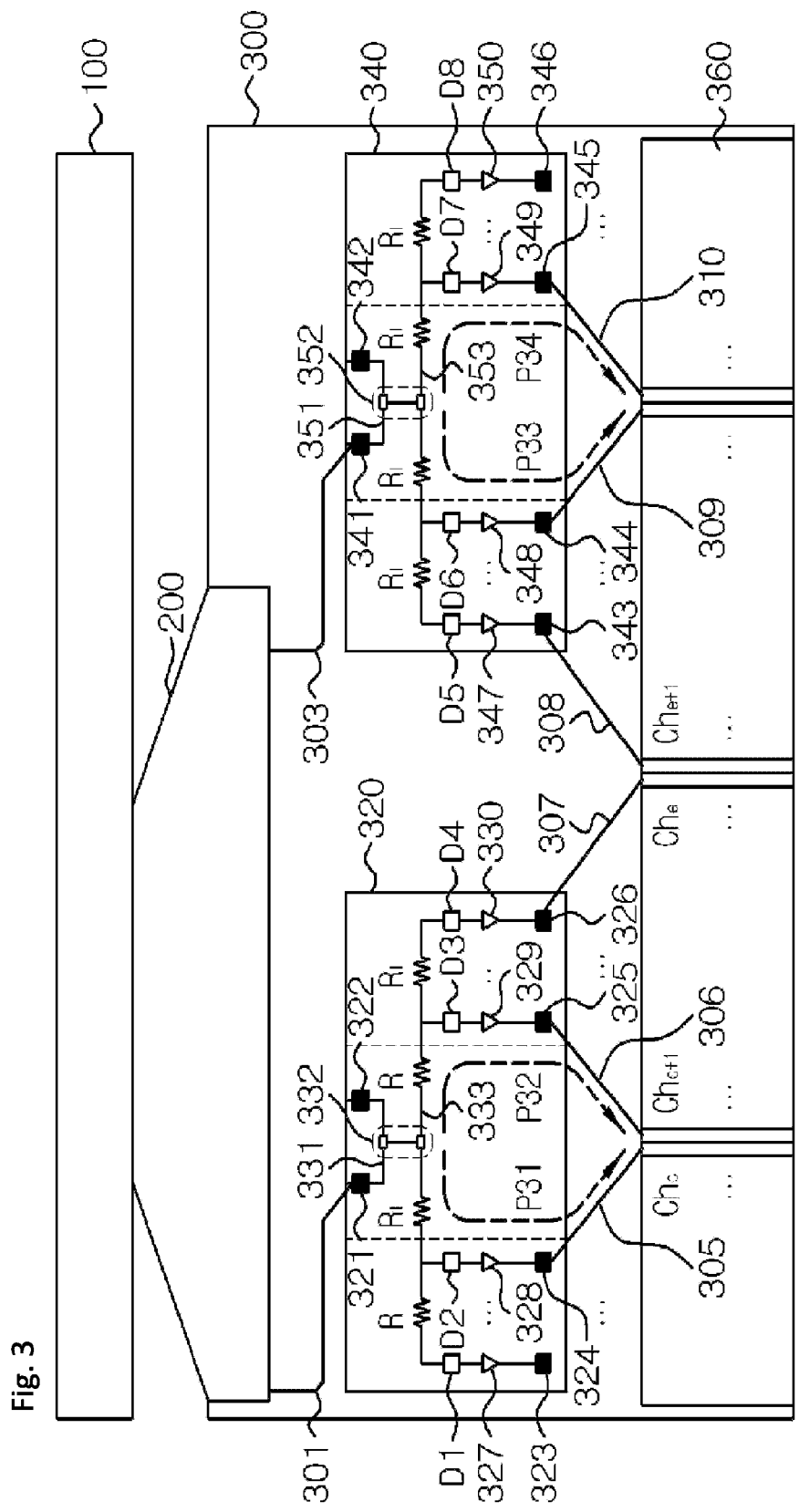
FIG. 3 is a circuit diagram for explaining an embodiment of a source driver integrated circuits and a display device including the same according to the present invention.

FIG. 3 is a circuit diagram for explaining an embodiment of a source driver integrated circuits and a display device including the same according to the present invention.

Referring to FIG. 3, the display device includes a PCB 100, a FPCB 200, source driver integrated circuits 320 and 340, and a display panel 360.

The PCB (Printed Circuit Board) 100 provides power to the source driver integrated circuits 320 and 340, and drives and controls the display device. The FPCB (Flexible Printed Circuit Board) 200 electrically connects the PCB 100 to the source driver integrated circuits 320 and 340 by using LOGs (Line On Glasses) 301 and 303. In this case, the power may be provided to the source driver integrated circuits 320 and 340 via the PCB 100 and the FPCB 200, and may be provided as a ground voltage GND, a supply voltage VDDH, and an intermediate supply voltage VDD/2 having a voltage level corresponding to ½ of the supply voltage VDDH. Hereinafter, the case in which the power is provided as the supply voltage VDDH will be described, but this does not limit the scope of the present invention.

The source driver integrated circuits 320 and 340 may be implemented with COG (Chip On Glass) and controls the operation of the display panel 360, and the display panel 360 includes a plurality of pixels two-dimensionally arranged. For example, the display panel 360 may correspond to a FPD (Flat Panel Device), and may be implemented with an LCD (Liquid Crystal Display), OLED (Organic Light Emitting Diodes), and the like. In more details, the display panel 360 includes a plurality of channels Chc, Chc+1, Che, and Che+1, and the source driver integrated circuits 320 and 340 provide driving voltages (that is, panel driving signals) to the plurality of channels Chc, Chc+1, Che, and Che+1.

The display panel 360 includes a plurality of pixels that perform a display operation, and receives power from the source driver integrated circuits 320 and 340 to control the operation of the display panel 360. Furthermore, the display panel 360 is divided into the plurality of channels Chc, Chc+1, Che, and Che+1, wherein the channels Chc, Chc+1, Che, and Che+1 receive power through metal lines 305 to 310. The metal lines 305 to 310 may be implemented with LOG and are electrically connected to the source driver integrated circuits 320 and 340.

Hereinafter, since the source driver integrated circuits 320 and 340 are substantially equal to each other, the source driver integrated circuit 320 will be representatively described.

The source driver integrated circuit 320 includes a plurality of pads 321 and 322 for inputting power, an internal power line 331, a common node 332, a common power line 333, a plurality of panel driving circuits D1 to D4, a plurality of buffers 327 to 330, and a plurality of driving signal output pads 323 to 326.

The source driver integrated circuit 320 receives power, which is supplied from the PCB 100 and the FPCB 200, through a portion (for example, 321) of the plurality of pads 321 and 322 for inputting power.

The portion(s) (for example, 321) of the plurality of pads 321 and 322 for inputting power is connected to an external power source (for example, VDDH), and the remainder(s) (for example, 322) of the pads is connected to the portion(s) (for example, 321) of the pads through the common node 332. In more detail, the plurality of pads 321 and 322 for inputting power are connected to each other through the internal power line 331 and the common node 332 on the internal power line 331. In an embodiment, the portion(s) (for example, 321) of the pads may be electrically connected to the external power source (for example, VDDH) through the LOG (Line On Glass).

In the example of FIG. 3, the two pads 321 and 322 for inputting power may be arranged at the center (for example, an upper end) of one side of the source driver integrated circuit 320, and one pad 321 for inputting power may receive power via the LOG 301. Furthermore, the two pads 321 and 322 for inputting power may form a pair at symmetrical places about a virtual center line of the source driver integrated circuit 320.

The internal power line 331 connects the plurality of pads 321 and 322 for inputting power to each other, and includes a portion of the common node 332. In an embodiment, the internal power line 331 may include a portion of the common node 332 at a substantial center, wherein the substantial center may correspond to a physical center position of the internal power line 331 or a zero voltage position of the internal power line 331. The zero voltage position of the internal power line 331 may correspond to a position at which a resistance between the portion(s) (for example, 321) of the pads and the common node 332 and a resistance between the remainder(s) (for example, 322) of the pads and the common node 332 are substantially equal to each other, and thus a voltage difference therebetween corresponds to zero.

The common node 332 may connect the plurality of pads 321 and 322 for inputting power to the common power line 333. In an embodiment, the common node 332 may connect a substantial center of the internal power line 331 to a substantial center of the common power line 333, and may be implemented with a first metal line that connects such centers to each other. In another embodiment, the common node 332 may be implemented with one substantial point that connects the substantial center of the internal power line 331 to the substantial center of the common power line 333.

The common power line 333 is connected to the plurality of pads 321 and 322 for inputting power through the common node 332. In an embodiment, the common power line 333 may include a portion of the common node 332 at the substantial center, wherein the substantial center may correspond to a physical center position of the common power line 333 or a zero voltage position of the common power line 333. The zero voltage position of the common power line 333 may correspond to a position at which resistances between the panel driving circuit(s) D1 to D4, which are symmetrical to each other about the common power line 333 and the common node 332, are substantially equal to each other, and thus a voltage difference therebetween corresponds to zero. For example, the zero voltage position of the common power line 333 may correspond to a position at which a resistance between the common node 332 and the panel driving circuits D1 and D2 and a resistance between the common node 332 and the panel driving circuits D3 and D4 are substantially equal to each other.

The plurality of panel driving circuits D1 to D4 generate panel driving signals by using the power transferred from the plurality of pads 321 and 322 for inputting power. The panel driving signals correspond to driving voltages for the operation of the plurality of channels Chc, Chc+1, and Che, and are transferred to the plurality of channels Chc, Chc+1, and Che through the plurality of driving signal output pads 323 to 326. Resistances between the common power line 333 and adjacent panel driving circuits (for example, D2 and D3) are substantially equal to each other.

The plurality of buffers 327 to 330 may be connected between the plurality of panel driving circuits D1 to D4 and the plurality of driving signal output pads 323 to 326. That is, the plurality of buffers 327 to 330 may be arranged between the common node 332 and the channels Chc, Chc+1, or Che.

The plurality of driving signal output pads 323 to 326 may be arranged at the other side of the source driver integrated circuit 320, wherein each of the plurality of driving signal output pads 323 to 326 transfers a panel driving signal to a corresponding channel Chc, Chc+1, or Che through a second metal line. For example, the other side may correspond to a lower end, a left side, or a right side in terms of the plurality of pads 321 and 322 for inputting power. The plurality of driving signal output pads 323 to 326 may be connected to the common power line 333, and may be symmetrically arranged about the common node 332. Furthermore, symmetrical driving signal output pads (for example, 324 and 325) of the plurality of driving signal output pads 323 to 326 provide driving signals to channels (for example, Chc and Chc+1) symmetrical to each other about the common node 332.

Hereinafter, the structure of the display device illustrated in FIG. 3 will be described.

The display panel 360 includes the plurality of channels Chc, Chc+1, Che, and Che+1, and the plurality of panel driving circuits D1 to D4 and D5 to D8 generate driving voltages (that is, panel driving signals) related to the operations of the plurality of channels Chc, Chc+1, Che, and Che+1 and transmit the panel driving signals to the panel driving signal output pads 323 to 326 and 343 to 346 through the buffers 327 to 330 and 347 to 350. In this case, resistance values RL between the common node 332 and symmetrical channels may be substantially equal to each other. Furthermore, distance values between the common node 332 and the symmetrical channels (for example, Chc and Chc+1) may be substantially equal to each other. The source driver integrated circuit 320 electrically connects power, which is received through one pad 321 of the two pads 321 and 322 for inputting power, to the other pad 322 by using the internal power line 331. Such power is used for the operation of the source driver integrated circuit 320, and the plurality of buffers 327 to 330 may be designed based on the sheet resistance RL of the common power line 333. In FIG. 3, the source driver integrated circuit 320 is divided by three vertical dotted lines, wherein in a center area, a circuit for controlling the operation of the source driver integrated circuit 320 may be installed, and in peripheral areas, circuits for controlling the plurality of panel driving circuits D1 to D4 may be installed.

While various embodiments have been described above, it will be understood to those skilled in the art that the embodiments described are by way of example only. Accordingly, the disclosure described herein should not be limited based on the described embodiments.

What is claimed is:

1. A source driver integrated circuit comprising:
   a plurality of pads for inputting power, a portion of the pads being directly connected to an external power source, a remainder of the pads being indirectly connected to the external power source;
   an internal power line that connects the plurality of pads for inputting power to each other;
   a common power line that connects a plurality of panel driving circuits to each other; and
   a common node that connects a substantial center point of the internal power line to a substantial center point of the common power line.

2. The source driver integrated circuit according to claim 1, wherein the portion is electrically connected to the external power source through line on glass.

3. The source driver integrated circuit according to claim 1, further comprising:
   a plurality of driving signal output pads connected to the plurality of panel driving circuits respectively and symmetrically arranged about the common node.

4. The source driver integrated circuit according to claim 3, wherein among the plurality of driving signal output pads, symmetrical driving signal output pads provide driving signals to channels symmetrical about the common node, respectively.

5. The source driver integrated circuit according to claim 4, wherein resistance values between the common node and the symmetrical channels are substantially equal to each other.

6. The source driver integrated circuit according to claim 5, wherein distance values between the common node and the symmetrical channels are substantially equal to each other.

7. The source driver integrated circuit according to claim 1, further comprising:
   buffers arranged between the common node and the channels, respectively.

8. The source driver integrated circuit according to claim 1, wherein the plurality of pads for inputting power are symmetrically arranged about the common node.

9. A source driver integrated circuit comprising:
   a plurality of pads for inputting power, a portion of the pads being directly connected to an external power source, a remainder of the pads being indirectly connected to the external power source;
   an internal power line that connects the plurality of pads for inputting power to each other; and
   a common power line that connects a plurality of panel driving circuits to each other,
   wherein the internal power line and the common power line are connected to each other at a substantial center point of the internal power line and at a substantial center point of the common power line.

10. The source driver integrated circuit according to claim 9, further comprising:
    a plurality of driving signal output pads;
    a plurality of panel driving circuits that generate panel driving signals by using power transferred from the plurality of pads for inputting power and provide the panel driving signals to the plurality of driving signal output pads; and
    a metal line that connects the the plurality of driving signal output pads to external channels, respectively.

11. The source driver integrated circuit according to claim 10, wherein the plurality of panel driving circuits are symmetrically arranged about the substantial center point of the common power line.

12. The source driver integrated circuit according to claim 10, further comprising:
    buffers arranged between the plurality of panel driving circuits and the plurality of driving signal output pads, respectively.

13. The source driver integrated circuit according to claim 12, wherein resistances between the substantial center point of the common power line and the symmetrical panel driving circuits are substantially equal to each other.

14. The source driver integrated circuit according to claim 9, wherein the portion receives one of a ground voltage, a supply voltage, and an intermediate supply voltage.

* * * * *